(12) United States Patent
Guitton et al.

(10) Patent No.: US 8,773,823 B2
(45) Date of Patent: Jul. 8, 2014

(54) OVERVOLTAGE PROTECTION STRUCTURE FOR A DIFFERENTIAL LINK

(75) Inventors: Fabrice Guitton, Monnaie (FR); Benjamin Thon, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 527 days.

(21) Appl. No.: 13/105,253

(22) Filed: May 11, 2011

(65) Prior Publication Data
US 2011/0279934 A1    Nov. 17, 2011

(30) Foreign Application Priority Data

May 12, 2010    (FR) ...................... 10 53716

(51) Int. Cl.
*H02H 9/00*    (2006.01)
(52) U.S. Cl.
USPC .......................................................... 361/56
(58) Field of Classification Search
USPC .................................................. 361/119, 56
See application file for complete search history.

(56) References Cited

U.S. PATENT DOCUMENTS

| 6,377,434 | B1 * | 4/2002 | Martineau et al. ............ 361/119 |
| 7,266,195 | B1 * | 9/2007 | Dupuis et al. ................. 379/412 |
| 7,679,878 | B2 * | 3/2010 | Maggiolino ................... 361/119 |
| 2003/0123208 | A1 | 7/2003 | Napiorkowski |
| 2008/0062600 | A1 | 3/2008 | Crawley et al. |

FOREIGN PATENT DOCUMENTS

DE    202004002039    4/2004

OTHER PUBLICATIONS

French Search Report dated Nov. 15, 2010 from corresponding French Application No. 10/53716.

* cited by examiner

*Primary Examiner* — Stephen W Jackson
(74) *Attorney, Agent, or Firm* — Wolf, Greenfield & Sacks, P.C.

(57) ABSTRACT

A structure for protecting an integrated circuit connected to first and second rails of a differential link against overvoltages, including: a first bidirectional conducting device, between the first rail and a common node; a second bidirectional conducting device, between the second rail and the common node; and a capacitor between the common node and a low reference potential rail.

16 Claims, 2 Drawing Sheets

OVERVOLTAGE PROTECTION STRUCTURE FOR A DIFFERENTIAL LINK

CROSS REFERENCE TO RELATED APPLICATIONS

This application claims the priority benefit of French patent application number 10/53716, filed on May 12, 2010, entitled OVERVOLTAGE PROTECTION STRUCTURE FOR A DIFFERENTIAL LINK, which is hereby incorporated by reference to the maximum extent allowable by law.

BACKGROUND OF THE INVENTION

1. Field of the Invention

The present invention relates to a structure of protection of an integrated circuit against overvoltages due, for example, to electrostatic discharges. It more specifically aims at a structure for protecting a circuit connected to a differential data transmission line.

2. Discussion of the Related Art

FIG. 1 is a very simplified electric diagram of a device comprising an integrated circuit IC1 capable of communicating, via a differential transmission line or connection 10, with a device, not shown. Link 10 comprises two rails 11 and 12, respectively connected to terminals 13 and 14 of circuit IC1. In operation, data signals of the same amplitude but in phase opposition flow through rails 11 and 12. This link type is generally used for broadband data transmission.

FIG. 2 is a timing diagram schematically illustrating the variation, during the device operation, of signals 21 and 22 on the respective rails 11 and 12 of link 10 of FIG. 1. In this example, signals 21 and 22 are digital signals capable of taking one or the other of two values $V_{MIN}$ and $V_{MAX}$, respectively high and low, centered on an average positive voltage $V_m$. $\Delta V$ will be used to designate the excursion of signals 21 and 22, that is, $\Delta V = V_{MAX} - V_m = V_m - V_{MIN}$. As illustrated in the drawing, signals 21 and 22 are of same amplitude but in phase opposition.

Signals 21 and 22 generally are signals with a low voltage level. As an example, average voltage $V_m$ may range between 0.1 and 5 V and, in most current differential transmission standards, excursion $\Delta V$ ranges between 0.1 and 0.6 V. Thus, value $V_{MAX}$ is generally smaller than 6 V. However, abrupt temporary overvoltages or over currents, of high amplitude, capable of damaging components of integrated circuit IC1 (FIG. 1), may occur on rails 11 and/or 12 of the differential link. Such overvoltages may occur while circuit IC1 is powered, during the normal operation of the device, or when circuit IC1 is not powered, for example, during assembly phases of the device.

It is generally provided to connect to differential link 10, between rails 11 and 12, a protection structure 15 (FIG. 1), capable of rapidly draining off significant currents that may appear when an overvoltage or electrostatic discharge occurs on rail 11 and/or on rail 12.

FIG. 3 is an electric diagram of a conventional example of protection structure 15 of FIG. 1. Structure 15 comprises a diode bridge comprising a diode 31 in series with a diode 33 and, in parallel, a diode 35 in series with a diode 37. A diagonal of the bridge is connected between rails 11 and 12. The other diagonal of the bridge is connected to a zener diode 39 having a grounded terminal.

It should be noted that term "ground" here designates a reference potential common to all the device elements, for example, a potential close to 0 V. In practice, structure 15 may be grounded via a ground terminal of integrated circuit IC1, or via a ground rail (not shown) comprised in link 10. In the following description, "positive potential" and "negative potential" will be used to designate, respectively, potentials greater than the ground potential and smaller than the ground potential, and each time digital potential values will be given as an example, it will be considered that these values refer to a ground potential equal to 0 V.

In case of a positive overvoltage on rail 11, if the overvoltage exceeds a given threshold, zener diode 39 becomes conductive by avalanche effect, and the overvoltage is removed towards the ground, via diode 33 and zener diode 39.

In case of a negative overvoltage on rail 11, diode 31 becomes conductive and the overvoltage is removed by this diode.

Similarly, in case of a positive overvoltage on rail 12, zener diode 39 becomes conductive by avalanche effect and the overvoltage is removed via diode 37 and zener diode 39. In case of a negative overvoltage on rail 12, the overvoltage is removed via diode 35.

Thus, structure 15 enables removing any overvoltage likely to occur on rails 11 and/or 12. The turn-on threshold for a positive overvoltage is equal to the forward voltage drop $V_F$ of a diode (on the order of 0.6 V) plus the avalanche voltage of zener diode 39. The turn-on threshold for a negative overvoltage is equal to the opposite of the forward voltage drop of a diode (on the order of –0.6 V).

Avalanche diode $V_{BR}$ of zener diode 39 must be greater than voltage $V_{MAX} - V_F$. This actually results, to take into account the component dispersion, in selecting an avalanche voltage much greater than $V_{MAX}$. This is a first disadvantage of such a protection structure.

Another disadvantage of this type of structure is that if circuits adapted to different levels $V_{MAX}$ are desired to be protected, zener diodes of low avalanche voltage should be provided to properly protect circuits adapted to signals of low level $V_{MAX}$. Thus, it should be provided to manufacture multiple specific protection structures adapted to the different circuits to be protected.

SUMMARY OF THE INVENTION

An embodiment provides a structure for protecting an integrated circuit connected to a differential transmission link overcoming at least some of the disadvantages of existing solutions.

An embodiment provides such a structure that can operate with no specific adaptation, whatever the type of signal present on the differential transmission link.

An embodiment of the present invention provides to form a self-adaptive protection structure, that is, having turn-on thresholds which automatically adapt to the voltage level of the signals on the differential transmission link.

An embodiment provides a structure for protecting an integrated circuit connected to first and second rails of a differential link against overvoltages, comprising: a first bidirectional conducting device between the first rail and a common node; a second bidirectional conducting device between the second rail and the common node; and a capacitor between the common node and a low reference potential rail.

According to an embodiment, the first device comprises at least one first diode and at least one second diode in antiparallel between the first rail and the common node, and the second device comprises at least one third diode and at least one fourth diode in antiparallel between the second rail and the common node.

According to an embodiment, the first and second rails are capable of conducting digital signals in phase opposition, with a peak-to-peak amplitude ranging between 0.2 and 1.2 V.

According to an embodiment, the first, second, third, and fourth diodes each comprise two diodes.

According to an embodiment, the first device comprises two zener diodes in antiseries between the first rail and the common node, and the second device comprises two zener diodes in antiseries between the second rail and the common node.

According to an embodiment, the capacitor has a capacitance ranging between 50 nF and 10 μF.

The foregoing and other objects, features, and advantages will be discussed in detail in the following non-limiting description of specific embodiments in connection with the accompanying drawings.

DETAILED DESCRIPTION

Figure 1:
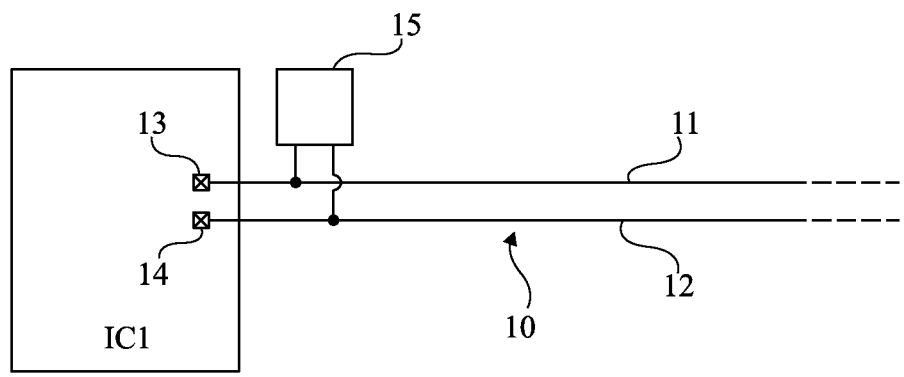
FIG. 1, previously described, is a simplified electric diagram of a device comprising an integrated circuit connected to a differential data transmission line.

For clarity, the same elements have been designated with the same reference numerals in the different drawings and, further, as usual in the representation of integrated circuits, the various drawings are not to scale.

Figure 4:
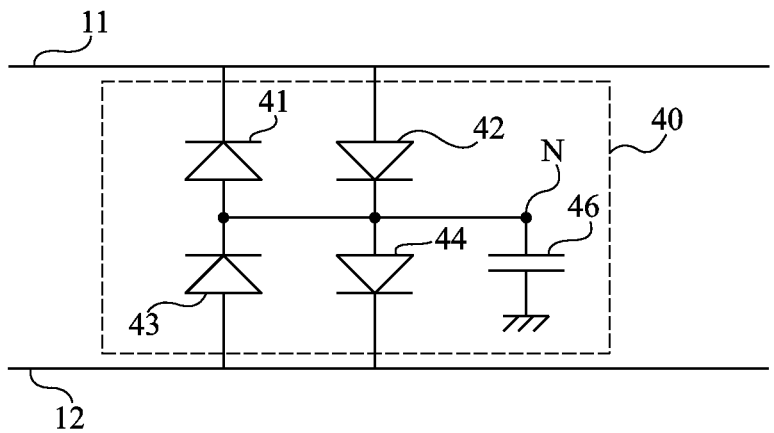
FIG. 4 is an electric diagram showing an embodiment of a structure for protecting the device of FIG. 1 against overvoltages.

FIG. 4 is an electric diagram showing an embodiment of a structure 40 for protecting a device of the type described in relation with FIG. 1 against overvoltages or electrostatic discharges.

Structure 40 comprises a diode 41 forward-connected between a node N and rail 11 of the differential link of the device, and a diode 42 in antiparallel, that is, reverse-connected between node N and rail 11. This structure further comprises a diode 43 reverse-connected between node N and rail 12 of the differential link, and a diode 44 in antiparallel, that is, forward-connected between node N and rail 12. Further, structure 40 comprises, between node N and the ground, a capacitor 46.

It should be noted that differential line protection structures generally are independent chips, capable of being connected to the differential line on the side of the circuit to be protected. However, structure 40 may also be integrated with the circuit which is desired to be protected (circuit IC1 of FIG. 1). In practice, structure 40 may be grounded via a ground terminal of the integrated circuit to be protected, or via a ground rail (not shown) comprised in the differential link.

When the device is not powered, capacitor 46 is not charged, and the potential of node N is substantially equal to the ground potential.

In case of an abrupt positive overvoltage on rail 11, forward-biased diode 42 becomes conductive. Thus, the overvoltage is removed through diode 42 and capacitor 46, with capacitor 46 letting through the current resulting from a fast overvoltage.

In case of an abrupt negative overvoltage on rail 11, diode 41 becomes conductive. Thus, the overvoltage is removed through capacitor 46 and diode 41.

Similarly, in case of a positive overvoltage on rail 12, the overvoltage is removed through diode 43 and capacitor 46, and in case of a negative overvoltage on rail 12, the overvoltage is removed through capacitor 46 and diode 44.

Thus, structure 40 is capable of rapidly removing any overvoltage likely to occur on rail 11 and/or on rail 12 when the device is not powered. The high and low triggering thresholds of the protection then respectively correspond to the forward voltage drop $V_F$ of a diode and to the opposite of the forward voltage drop of a diode (for example, 0.6 V and −0.6 V).

When the device is being started, in a phase of initialization of protection structure 40, capacitor 46 charges to a value linked to the amplitude of the signals conducted by rails 11 and 12 of the differential link.

Figure 2:
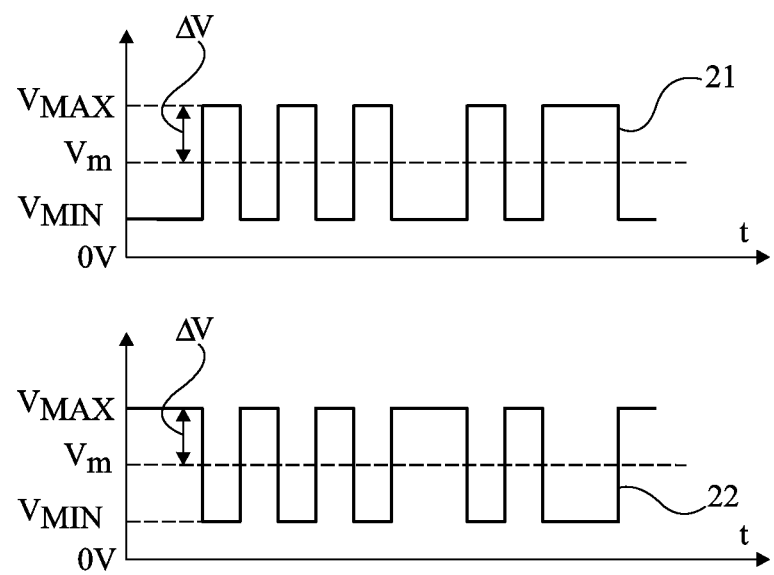
FIG. 2, previously described, is a simplified timing diagram showing the variation of the data signals on the rails of the differential line of FIG. 1.
Figure 3:
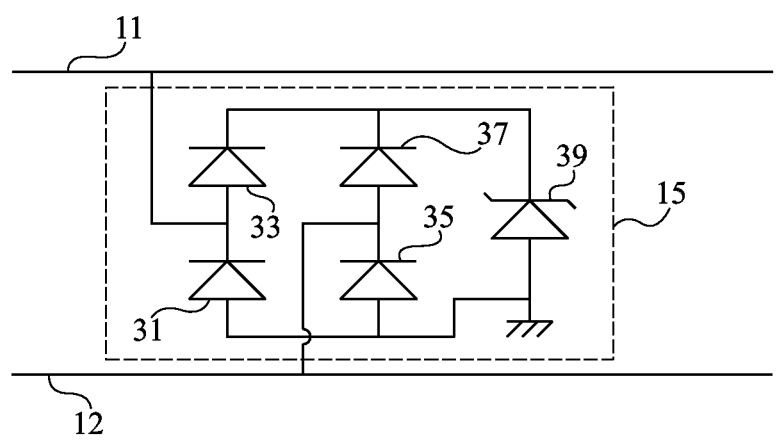
FIG. 3, previously described, is an electric diagram of a conventional example of a structure for protecting the device of FIG. 1 against overvoltages.

At a device starting time t0, capacitor 46 is discharged, and the voltage of node N is substantially equal to the ground potential. Since rails 11 and 12 conduct signals 21 and 22 of the type described in relation with FIG. 2, forward-biased diodes 42 and 43 become conductive. Capacitor 46 thus progressively charges to a value $V_{MAX}-V_F$ equal to maximum value $V_{MAX}$ of signals 21 and 22 minus forward voltage drop $V_F$ of diodes 42 and 43. Thus, after a number of waves of signals 21 and 22, the voltage at node N settles to $V_{MAX}-V_F$.

After this initialization phase, the high triggering threshold of the protection is equal to:

$$(V_{MAX}-V_F)+V_F=V_{MAX}$$

and the low triggering threshold of the protection is equal to:

$$(V_{MAX}-V_F)-V_F=V_{MAX}-2*V_F$$

An advantage of such a protection structure is that the high and low protection turn-on thresholds automatically adapt to the level of the signals which run through the differential line. Thus, this is a generic protection, which may be used in many types of application and for many differential data transmission standards (for example, standard HDMI, standard SATA, standard Display Port, etc.). Further, if the level of the signals transmitted over the differential line changes during the device operation, the protection turn-on threshold automatically adapt.

Another advantage of such a structure is that the protection turn-on thresholds are close to the maximum level of the desired signals transmitted over the transmission line. The chances of deterioration of the integrated circuit in case of an overvoltage are thus very low.

It should be noted that capacitor 46 should have a relatively high capacitance, to be able to let through large overvoltages without for its charge level to be altered by this. However, a high capacitance results in a greater bulk and in a longer initialization time of the protection structure on starting of the device. The present inventors have determined that a capacitance in the range of 50 nF to 10 μF generally is a good compromise, but any other capacitance can be used, for example a capacitance in the range of 1 nF to 10 mF.

It should further be noted that since the high and low triggering thresholds of structure 40 respectively are $V_{MAX}$ and $V_{MAX}-2*V_F$, excursion $\Delta V$ of the signals, on either side of average voltage $V_m$, must be smaller than $V_F$. However, since the voltage drop $V_F$ of a diode generally is on the order of 0.6 V, this structure is compatible with most current differential data transmission standards.

Figure 5:
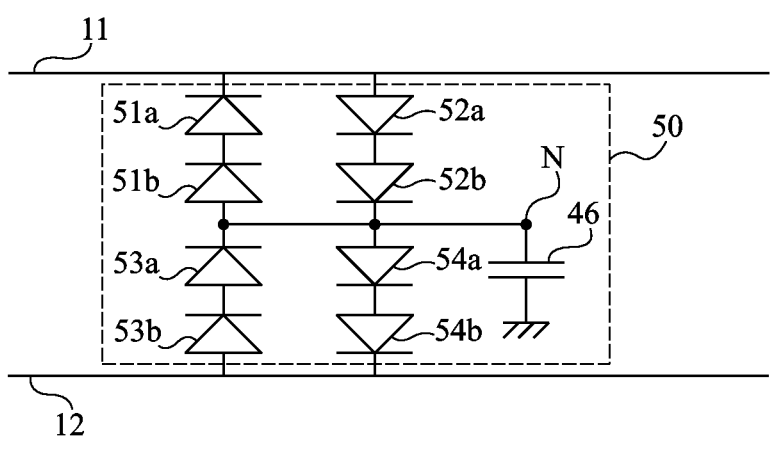
FIG. 5 is an electric diagram showing an alternative embodiment of the protection structure of FIG. 4.

FIG. 5 is an electric diagram showing an alternative embodiment of protection structure 40 of FIG. 4, capable of operating in the case where excursion ΔV of the signals transmitted over the differential line would be greater than voltage drop $V_F$ of a diode. In protection structure 50 of FIG. 5, each of diodes 41, 42, 43, 44 of the structure of FIG. 4 has been replaced with two diodes in series, respectively 51a and 51b, 52a and 52b, 53a and 53b, and 54a and 54b. Thus, the operation of structure 50 is identical to that of the structure of FIG. 4, with the difference that the voltage settling at common node N after the initialization phase is equal to $V_{MAX}-2*V_F$, and that the high and low protection turn-on thresholds respectively are $V_{MAX}$ and $V_{MAX}-4*V_F$. Thus, this structure can operate for signals having an excursion ΔV that may range up to $2*V_F$.

Specific embodiments of the present invention have been described. Various alterations, modifications, and improvements will occur to those skilled in the art.

In particular, in the embodiment of FIG. 5, it will be within the abilities of those skilled in the art to adapt the number of diodes in series to the excursion ΔV of the signals capable of being transmitted over the rails of the differential link.

Further, in protection structures of the type described in relation with FIG. 4 and FIG. 5, diodes 41 to 44, or 51a to 51b can be bipolar diodes, or Schottky diodes. In the embodiment described in relation with FIG. 4, it will be within the ability of those skilled in the art to replace diodes 41 to 44 by zener diodes.

One will note that in the embodiment of FIG. 4, diodes 41 and 42 on one side, and diodes 43 and 44 on the other side, constitute first and second bidirectional conducting devices. Similarly, in the embodiment of FIG. 5, diodes 51 and 52 on one side, and diodes 53 and 54 on the other side, constitute bidirectional conducting devices. It will be within the ability of those skilled in the art to replace these bidirectional conducting devices by any other adapted bidirectional conducting devices.

Figure 6:
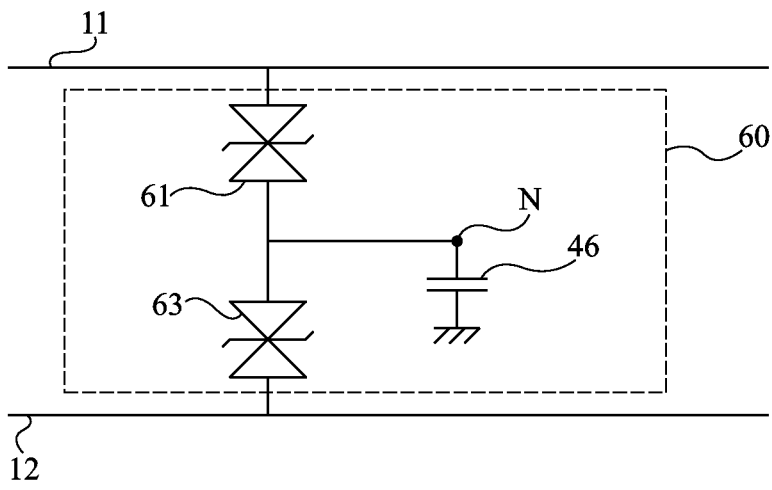
FIG. 6 is an electric diagram showing another alternative embodiment of the protection structure of FIG. 4.

FIG. 6 is an electric diagram showing an alternative embodiment of a protection structure of the type described in relation with FIGS. 4 and 5. In protection structure 60 of FIG. 6, diodes 41 and 42 of the structure of FIG. 4 have been replaced with a bidirectional conducting device 61, corresponding to two zener diodes in antiseries, for example with their cathodes coupled together, between the common node N and rail 11. Similarly, diodes 43 and 44 of FIG. 4 have been replaced with a bidirectional conducting device 63, corresponding to two zener diodes in antiseries between the common node N and rail 12.

The choice of the bidirectional conducting device may depend on the cost of the components, and, obviously on the desired triggering thresholds.

Of course, the present invention is likely to have various alterations, modifications and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A structure for protecting an integrated circuit connected to first and second rails of a differential link against overvoltages, comprising:
   a first bidirectional conducting device coupled between the first rail and a common node;
   a second bidirectional conducting device coupled between the second rail and the common node; and
   a capacitor connected between the common node and a low reference potential rail.

2. The protection structure of claim 1, wherein:
   said first device comprises at least one first diode and at least one second diode in antiparallel between the first rail and the common node; and
   said second device comprises at least one third diode and at least one fourth diode in antiparallel between the second rail and the common node.

3. The protection structure of claim 2, wherein digital signals in phase opposition, having a peak-to-peak amplitude ranging between 0.2 and 1.2 V are capable of flowing through the first and second rails.

4. The protection structure of claim 2, wherein said at least one first diode, at least one second diode, at least one third diode, and at least one fourth diode each comprise two diodes.

5. The protection structure of claim 1, wherein said first device comprises two zener diodes in antiseries between the first rail and the common node, and said second device comprises two zener diodes in antiseries between the second rail and the common node.

6. The protection structure of claim 1, wherein the capacitor has a capacitance ranging between 50 nF and 10 g.

7. An overvoltage protection circuit for a differential line, comprising:
   a first bidirectional conducting device coupled between a first conductor of the differential line and a common node;
   a second bidirectional conducting device coupled between a second conductor of the differential line and the common node; and
   a capacitor coupled between the common node and a reference potential, wherein the first and second bidirectional conducting devices are configured to establish, together with the capacitor, protection turn-on thresholds of the overvoltage protection circuit, wherein the first and second bidirectional conducting devices and the capacitor are configured to automatically adapt the protection turn-on thresholds to a signal level on the differential line.

8. An overvoltage protection circuit as defined in claim 7, wherein the first bidirectional conducting device comprises first and second diodes connected in parallel with opposite polarities, and wherein the second bidirectional conducting device comprises third and fourth diodes connected in parallel with opposite polarities.

9. An overvoltage protection circuit as defined in claim 7, wherein each of the first and second bidirectional conducting devices comprises a first branch and a second branch connected in parallel with the first branch, each branch including two or more diodes connected in series, wherein diodes of the first branch have opposite polarities from diodes in the second branch.

10. An overvoltage protection circuit as defined in claim 8, wherein the first, second, third and fourth diodes are selected from the group consisting of bipolar diodes, Schottky diodes and zener diodes.

11. An overvoltage protection circuit as defined in claim 7, wherein each of the first and second bidirectional conducting devices comprises first and second zener diodes connected in series and having opposite polarities.

12. An overvoltage protection circuit as defined in claim 7, wherein the reference potential is ground.

13. A method for overvoltage protection of a differential line, comprising:
- coupling a first bidirectional conducting device between a first conductor of the differential line and a common node;
- coupling a second bidirectional conducting device between a second conductor of the differential line and the common node;
- coupling a capacitor between the common node and a reference potential; and
- operating the first and second bidirectional conducting devices and the capacitor to establish protection turn-on thresholds for protection of the differential line, wherein operating the first and second bidirectional conducting devices and the capacitor comprises automatically adapting the protection turn-on thresholds to a signal level on the differential line.

14. A method for overvoltage protection of a differential line as defined in claim 13, wherein coupling a first bidirectional conducting device comprises connecting first and second diodes in parallel with opposite polarities and wherein coupling a second bidirectional conducting device comprises connecting third and fourth diodes in parallel with opposite polarities.

15. A method for overvoltage protection of a differential line as defined in claim 13, wherein coupling a first bidirectional conducting device comprises connecting first and second zener diodes in series with opposite polarities and wherein coupling a second bidirectional conducting device comprises connecting third and fourth zener diodes in series with opposite polarities.

16. The protection structure of claim 1, wherein the first and second bidirectional conducting devices and the capacitor are configured to establish protection turn-on thresholds and to automatically adapt the protection turn-on thresholds to a signal level on the differential link.

* * * * *

UNITED STATES PATENT AND TRADEMARK OFFICE
CERTIFICATE OF CORRECTION

| | |
|---|---|
| PATENT NO. | : 8,773,823 B2 |
| APPLICATION NO. | : 13/105253 |
| DATED | : July 8, 2014 |
| INVENTOR(S) | : Fabrice Guitton et al. |

It is certified that error appears in the above-identified patent and that said Letters Patent is hereby corrected as shown below:

In the Claims:

In column 6, line 27, claim 6, "10 g" should read --10 µF--

Signed and Sealed this
Seventh Day of October, 2014

Michelle K. Lee
*Deputy Director of the United States Patent and Trademark Office*